(12) United States Patent
Lu et al.

(10) Patent No.: US 12,289,893 B2
(45) Date of Patent: Apr. 29, 2025

(54) SEMICONDUCTOR DEVICES INCLUDING FTJ STRUCTURE

(71) Applicant: Taiwan Semiconductor Manufacturing Company, Ltd., Hsinchu (TW)

(72) Inventors: Chun-Chieh Lu, Taipei (TW); Qing Shi, Hsinchu (TW); Bo-Feng Young, Taipei (TW); Yu-Chuan Shih, Hsinchu (TW); Sai-Hooi Yeong, Hsinchu County (TW); Blanka Magyari-Kope, Hsinchu County (TW); Ying-Chih Chen, Hsinchu County (TW); Tzer-Min Shen, Hsinchu (TW); Yu-Ming Lin, Hsinchu (TW); Chung-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 254 days.

(21) Appl. No.: 17/740,369

(22) Filed: May 10, 2022

(65) Prior Publication Data

US 2023/0371273 A1 Nov. 16, 2023

(51) Int. Cl.
*H10B 53/30* (2023.01)
*H01L 29/78* (2006.01)
*H10B 53/10* (2023.01)
*H10B 53/20* (2023.01)

(52) U.S. Cl.
CPC ....... *H10B 53/30* (2023.02); *H01L 29/78391* (2014.09); *H10B 53/10* (2023.02); *H10B 53/20* (2023.02)

(58) Field of Classification Search
CPC ........ H01B 53/10; H01B 53/20; H10B 53/30; H01L 29/78391
See application file for complete search history.

(56) References Cited

U.S. PATENT DOCUMENTS

| 2017/0256552 A1* | 9/2017 | Schröder | G11C 11/2275 |
| 2023/0200078 A1* | 6/2023 | Popovici | H01L 28/60 |
| | | | 257/295 |

FOREIGN PATENT DOCUMENTS

| DE | 19931125 A1 * | 1/2001 | ....... H01L 21/28291 |
| EP | 0540993 A1 * | 5/2012 | |
| WO | WO-2015045592 A1 * | 4/2015 | ............. C01G 25/02 |
| WO | WO-2022091497 A1 * | 5/2022 | ......... G02B 26/0858 |

* cited by examiner

*Primary Examiner* — Matthew E Warren
(74) *Attorney, Agent, or Firm* — JCIPRNET (57) ABSTRACT

A semiconductor device includes a first electrode layer, a ferroelectric layer, a first alignment layer and a second electrode layer. A material of the first alignment layer includes rare-earth metal oxide. The ferroelectric layer and the first alignment layer are disposed between the first electrode layer and the second electrode layer, and the first alignment layer is disposed between the ferroelectric layer and the first electrode layer.

20 Claims, 7 Drawing Sheets

SEMICONDUCTOR DEVICES INCLUDING FTJ STRUCTURE

BACKGROUND

The integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
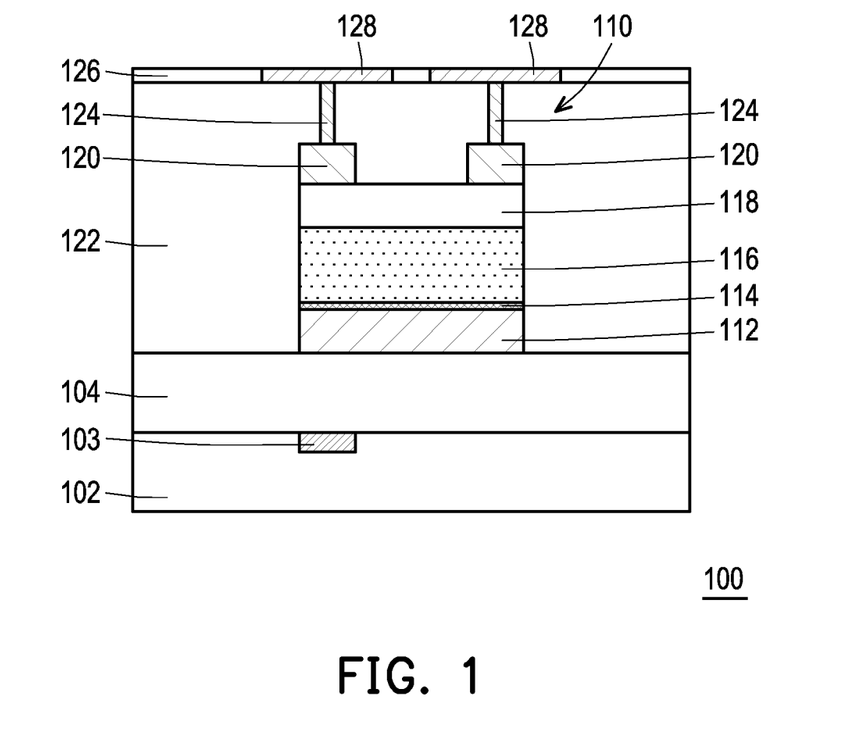
FIG. 1 illustrates a cross-sectional view of a semiconductor device in accordance with some embodiments of the disclosure.

FIG. 1 illustrates a cross-sectional view of a semiconductor device in accordance with some embodiments of the disclosure.

Referring to FIG. 1, a semiconductor device 100 includes a transistor 110 such as a FeFET. The transistor 110 is disposed on a dielectric layer 104 over a substrate 102, and includes an electrode layer 112, an alignment layer 114, a ferroelectric layer 116, a channel region 118 and source and drain regions 120, for example.

In some embodiments, the substrate 102 is a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. A device 103, such as a transistor (e.g., front-end-of-line transistor), a diode, a capacitor, a resistor, etc., may be formed in and/or on the substrate 102 and may be interconnected by interconnect structures formed by, for example, metallization patterns in one or more dielectric layers over the substrate 102.

The dielectric layer 104, which may be an interlayer dielectric (ILD) layer, is formed over the substrate 102. The dielectric layer 104 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like. In some embodiments, a contact (not shown) is formed in the dielectric layer 104 to electrically couple to the device 103. The contact may be formed by forming an opening in the dielectric layer 104 and filling the opening with an electrically conductive material (e.g., copper, tungsten, or the like).

In some embodiments, the electrode layer 112 is also referred to as a back gate. The electrode layer 112 is disposed on the dielectric layer 104. In some embodiments, the electrode layer 112 is formed by deposition and/or photolithography and etching process. In some embodiments, a metallic material is deposited through atomic layer deposition (ALD), CVD, physical vapor deposition (PVD), or the like. Thereafter, a patterned photoresist layer (not shown) is formed on the metallic material to define the shape of the subsequently formed electrode layer 112. Subsequently, an etching process is performed to remove the metallic material that is not covered by the patterned photoresist layer. The etching process includes, for example, an anisotropic etching process such as dry etch or an isotropic etching process such as wet etch. Then, the patterned photoresist layer is removed through a stripping process or the like to expose the remaining metallic material, which constitutes the electrode layer 112. In some alternative embodiments, the electrode layer 112 may be formed by a single damascene process. For example, a trench is first formed in a dielectric layer, followed by filling the trench with a metallic material. A planarization process such as a CMP process is then performed to remove the excess portions of the metallic material higher than the top surface of the dielectric layer, leaving the electrode layer 112 in the trench.

In some embodiments, the metallic material of the electrode layer 112 includes copper, titanium, tantalum, tungsten, aluminum, zirconium, hafnium, cobalt, ruthenium, molybdenum, titanium aluminum, tantalum aluminum, titanium nitride, tantalum nitride, tungsten aluminum, zirconium aluminum, hafnium aluminum, tungsten carbon nitride, any other suitable metal-containing material, or a combination thereof. In some embodiments, the electrode layer 112 also includes materials to fine-tune the corresponding work function. For example, the metallic material of the electrode layer 112 may include p-type work function materials such as Ru, Mo, WN, $ZrSi_2$, $MoSi_2$, $TaSi_2$, $NiSi_2$, or combinations thereof, or n-type work function materials such as Ag, TaCN, Mn, or combinations thereof.

In some embodiments, the ferroelectric layer 116 is disposed on the electrode layer 112. The ferroelectric layer 116 includes hafnium zirconium oxide (HfZrO), hafnium aluminum oxide (HfAlO), hafnium lanthanum oxide (HfLaO), hafnium cerium oxide (HfCeO), hafnium oxide ($HfO_2$), hafnium gadolinium oxide (HfGdO), hafnium silicon oxide (HfSiO) or a combination thereof, for example. In an embodiment, the ferroelectric layer 116 includes HfZrO, and a content of Zr is in a range of 30% to 70%. The foregoing materials may be deposited by suitable fabrication techniques such as ALD, CVD, metalorganic CVD (MOCVD), PVD, PECVD, thermal oxidation, UV-ozone oxidation, remote plasma atomic layer deposition (RPALD), plasma-enhanced atomic layer deposition (PEALD), molecular beam deposition (MBD), or combinations thereof. In some embodiments, the ferroelectric layer 116 has a thickness ranging from about 50 Å to about 150 Å. However, the disclosure is not limited thereto. In some embodiments, the ferroelectric layer 116 is made of a single layer having one of the foregoing materials. However, the disclosure is not limited thereto. In some alternative embodiments, the ferroelectric layer 116 may be made of a laminate structure of at least two of the foregoing materials.

In some embodiments, the alignment layer 114 is disposed between the electrode layer 112 and the ferroelectric layer 116. In some embodiments, the alignment layer 114 is in direct contact with the ferroelectric layer 116. The material of the alignment layer 114 includes rare-earth metal oxide such as LaO, CeO, $CeAlO_3$ and a combination thereof. The foregoing materials may be deposited by suitable fabrication techniques such as ALD, CVD, PVD, PECVD, PEALD, or combinations thereof. For example, the alignment layer 114 is formed by a low-temperature ALD process at a temperature ranging from about 300° C. to about 700° C., which may be integrated into back end of line (BEOL). In some embodiments, the alignment layer 114 has a thickness ranging from about 0.1 nm to about 5 nm. However, the disclosure is not limited thereto. In some embodiments, the alignment layer 114 is made of a single layer having one of the foregoing materials. However, the disclosure is not limited thereto. In some alternative embodiments, the alignment layer 114 may be made of a laminate structure of at least two of the foregoing materials.

Figure 2:
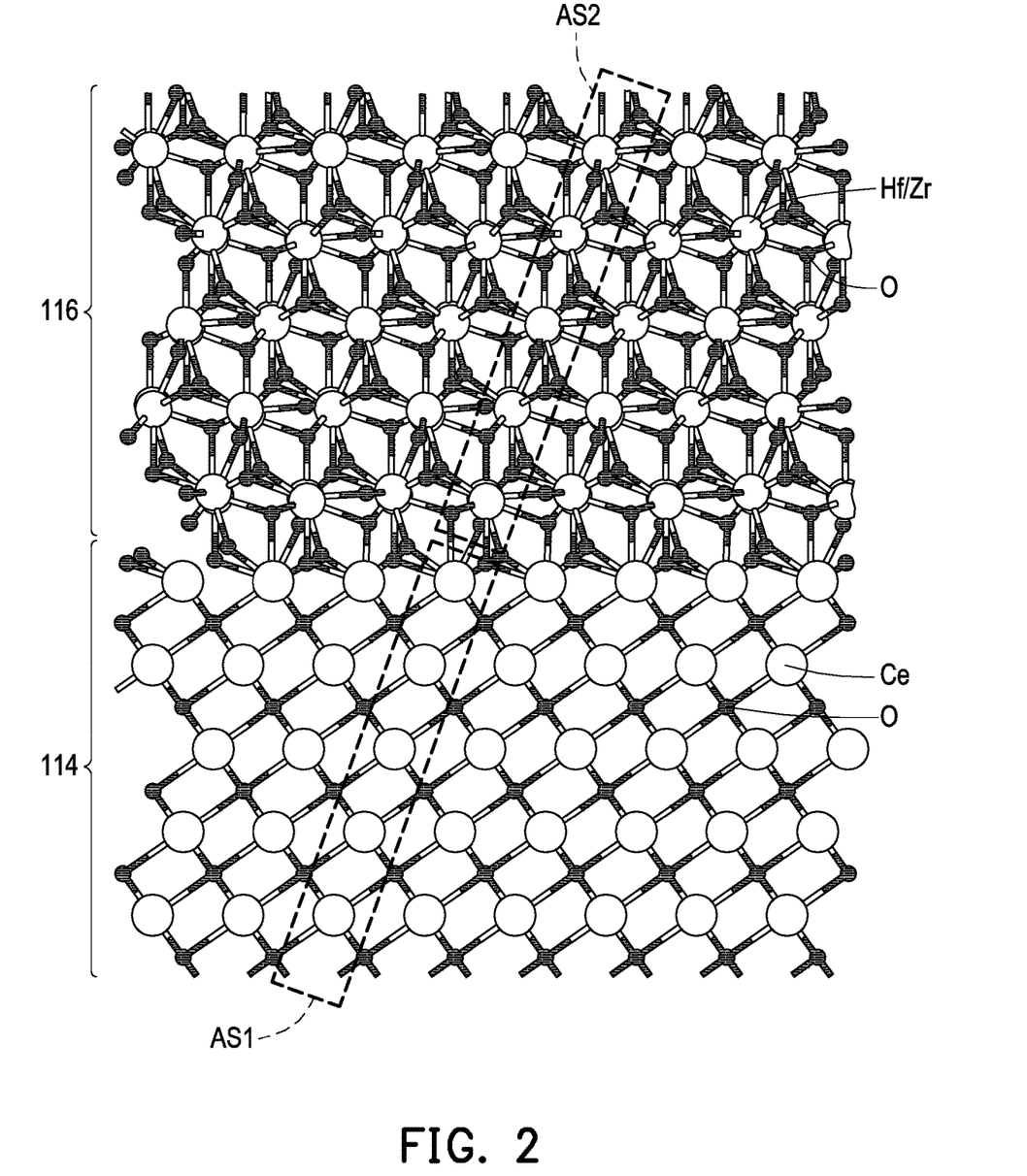
FIG. 2 is a schematic view of crystal lattice orientations of lattices of an alignment layer and a ferroelectric layer of a semiconductor device according to some embodiments of the disclosure.

In some embodiments, the alignment layer 114 functions as a conducting layer that would not contribute voltage drop and is electrically connected to the ferroelectric layer 116. For example, the alignment layer 114 has a band gap smaller than 50 meV. In addition, the alignment layer 114 is suitable for re-crystallization with small lattice mismatch. In some embodiments, when the ferroelectric layer 116 is determined to have the crystal lattice orientation such as the crystal lattice orientation (001), (010) or (111), the alignment layer 114 has the same crystal lattice orientation with the ferroelectric layer 116. For example, as shown in FIG. 2, when the ferroelectric layer 116 of HZO is determined to have the crystal lattice orientation (111), and the alignment layer 114 of CeO has the crystal lattice orientation (111), so that atomic stacking AS1 of the alignment layer 114 matches atomic stacking AS2 of the ferroelectric layer 116. Similarly, when the ferroelectric layer 116 has the crystal lattice orientation (001), the alignment layer 114 has the same crystal lattice orientation (001), and when the ferroelectric layer 116 has the crystal lattice orientation (010), the alignment layer 114 has the same crystal lattice orientation (010). Accordingly, when the ferroelectric layer 116 is grown on the alignment layer 114 having a preferential orientation, the alignment layer 114 stabilizes and maintains the phase (such as o-phase) of the ferroelectric layer 116 over non-polar phases during cycling (e.g., equal to or larger than 1e6 cycling). In addition, interfacial layer (which causes the breakdown easily) or non-perfect latticing matching layer (which causes ferroelectric dead layer or domain pinning) does not exist, and thus the remanent polarization (2Pr) value is not degraded during cycling and is improved. In some embodiments, the lattice constant mismatch between the alignment layer 114 and the ferroelectric layer 116 is smaller than 5%, and the angle difference is smaller than 1 degree. In addition, interfacial contact is improved by inserting the alignment layer 114 between the electrode layer 112 and the ferroelectric layer 116, and interfacial mixing and oxygen transport, which cause the formation of barrier, may be suppressed. In addition, the formation energy of the alignment layer 114 is similar to that of the ferroelectric layer 116. For example, a cohesive energy delta (e.g., oxide formation energy delta) of the alignment layer 114 is smaller than 30 meV compared with the ferroelectric layer 116. In other words, the $V_O$ formation energy between the alignment layer 114 (e.g., about 7 eV) and the ferroelectric layer 116 (e.g., about 7 eV) is controlled as being similar, and thus the fatigue may be suppressed.

In some embodiments, the channel region 118 is a channel layer disposed on the ferroelectric layer 116. The channel region 118 may have a thickness ranging from about 20 Å to about 100 Å. In some embodiments, the channel region 118 includes oxide semiconductor material such as ZnO, InO, GaO, ITO, InZnO (IZO), InGaZnO (IGZO), InWO, the like, or a combination thereof. In some embodiments, the channel region 118 is made of a single layer having one of the foregoing materials. However, the disclosure is not limited thereto. In some alternative embodiments, the channel region 118 may be made of a laminate structure of at least two of the foregoing materials. In some embodiments, the channel region 118 is deposited by suitable techniques, such as CVD, ALD, PEALD, PVD, PECVD, epitaxial growth, or the like.

In some embodiments, the source and drain regions 120 are disposed at opposite sides of the electrode layer 112 on the channel region 118. In some embodiments, a material of the source and drain regions 120 includes cobalt, tungsten, copper, titanium, tantalum, aluminum, zirconium, hafnium, a combination thereof, or other suitable metallic materials. In some embodiments, the source and drain regions 120 are formed through CVD, ALD, plating, or other suitable deposition techniques.

In some embodiments, a dielectric layer 122 is formed over the transistor 110. The material of the dielectric layer 122 includes $SiO_2$, SiN, a low-K dielectric material, or the like. The dielectric layer 122 may be formed by CVD, PVD, or the like. In some embodiments, source and drain contacts 124 are formed to extend from the upper surface of the dielectric layer 122 into the dielectric layer 122, and to electrically couple to the source and drain regions 120. In some embodiments, a material of the source and drain contacts 124 is the same as the material of the source and drain regions 120. However, the disclosure is not limited thereto. In some alternative embodiments, the material of the source and drain contacts 124 may be different from the material of the source and drain regions 120. In some embodiments, the material of the source and drain contacts 124 includes cobalt, tungsten, copper, titanium, tantalum, aluminum, zirconium, hafnium, a combination thereof, or other suitable metallic materials.

Next, a dielectric layer 126 is formed over the dielectric layer 122, and conductive lines 128 are formed in the dielectric layer 126. In some embodiments, the conductive lines 128, are electrically coupled to the source and drain contacts 124, respectively. The dielectric layer 126 may include a same or similar material as the dielectric layer 122, and may be formed using a same or similar formation method, and thus details are not repeated. The conductive lines 128 may be formed using any suitable method, such as a damascene process. For example, trenches are first formed in the dielectric layer 126, followed by filling the trenches with a metallic material. A planarization process such as a CMP process is then performed to remove the excess portions of the metallic material higher than the top surface of the dielectric layer 126, leaving the conductive lines 128 in the trenches. In some alternative embodiments, the conductive lines 128 and the source and drain contacts 124 are formed together in a dual-damascene process, in which case the dielectric layers 122, 126 may be formed together as one layer. For example, trenches connecting with openings are formed in the dielectric layer, followed by filling the trenches and the openings with a metallic material. A planarization process such as a CMP process is then performed to remove the excess portions of the metallic material higher than the top surface of the dielectric layer, leaving the conductive lines 128 in the trenches and the source and drain contacts 124 in the openings. The metallic material may include aluminum, titanium, copper, nickel, tungsten, or alloys thereof. In some embodiments, the dielectric layers 104, 122, 126 and the conductive lines 128 are portions of an interconnect structure on the substrate 102, and the transistor 110 is embedded in the interconnect structure. The transistor 110 may be a back end of line (BEOL) transistor. In some embodiments, a passivation layer (not shown), a post-passivation layer (not shown), a plurality of conductive pads (not shown) in the passivation layer, and a plurality of conductive terminals (not shown) in the post-passivation layer are disposed on the interconnect structure. It should be noted that one or more connection tiers may be interposed between the transistor 110 and the conductive line 128, with conductive patterns of the connection tiers establishing electrical connection between the transistor 110 and the conductive line 128. In addition, although the conductive lines 128 are illustrated as at the same level, they may at different height.

In some embodiments, by inserting the alignment layer 114 between the electrode layer 112 and the ferroelectric layer 116, the alignment layer 114 may be electrically connected to the electrode layer 112 while keeping crystalline structure perfectly at the interface of the alignment layer 114 and the ferroelectric layer 116. Thus, the FeFET may have a high endurance performance.

Figure 3:
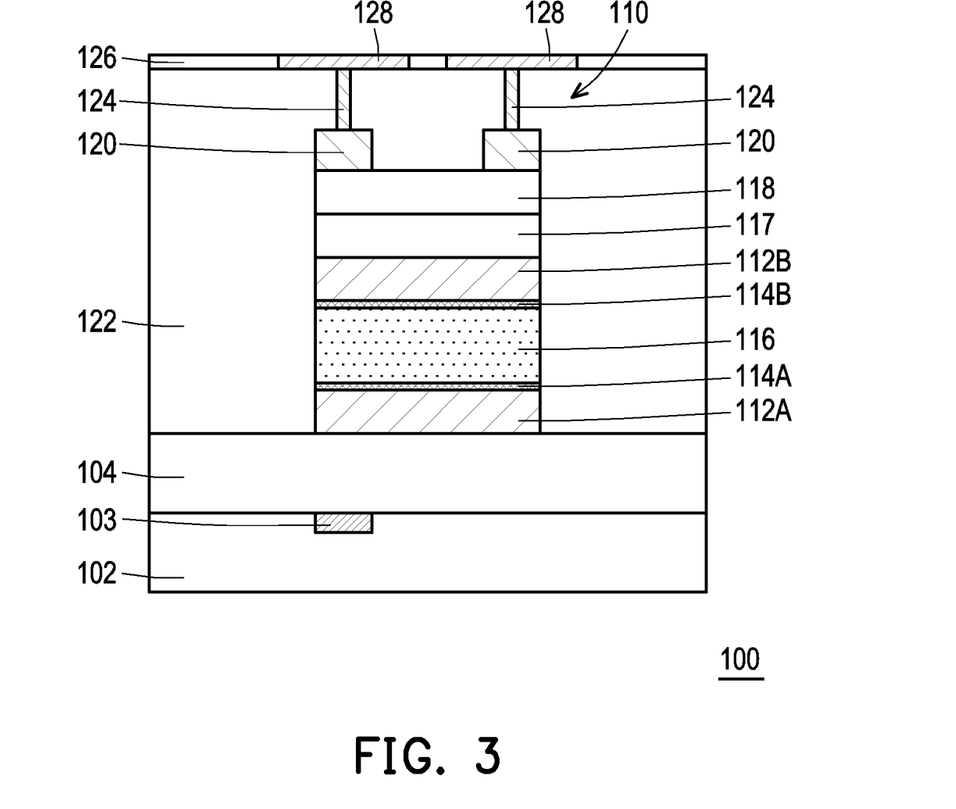
FIG. 3 is a cross-sectional view of a semiconductor device in accordance with some alternative embodiments of the disclosure.

FIG. 3 is a cross-sectional view of a semiconductor device in accordance with some alternative embodiments of the disclosure. Referring to FIG. 3, a semiconductor device 100 in FIG. 3 is similar to the semiconductor device 100 in FIG. 1, so similar elements are denoted by the same reference numeral and the detailed description thereof is omitted herein.

In some embodiments, the semiconductor device 100 includes a transistor 110 such as a FeFET. The transistor 110 is disposed on a dielectric layer 104 over a substrate 102. In some embodiments, the semiconductor device 100 is a FeFET and includes electrode layers 112A, 112B, alignment layers 114A, 114B, a ferroelectric layer 116, a dielectric layer 117, a channel region 118 and source and drain regions 120.

In some embodiments, the electrode layer 112A, the alignment layer 114A, the ferroelectric layer 116, the alignment layer 114B and the electrode layer 112B are sequentially formed on a dielectric layer 104. The ferroelectric layer 116 is disposed between the electrode layers 112A, 112B. The alignment layer 114A is disposed between the electrode layer 112A and the ferroelectric layer 116, and the alignment layer 114B is disposed between the electrode layer 112B and the ferroelectric layer 116, for example. However, the disclosure is not limited thereto. In some alternative embodiments, at least one of the alignment layers 114A, 114B is omitted. In some embodiments, the alignment layer 114A is in direct contact with the ferroelectric layer 116, and the alignment layer 114B is in direct contact with the ferroelectric layer 116. In other words, the ferroelectric layer 116 is sandwiched between the alignment layers 114A, 114B, and opposite surfaces of the ferroelectric layer 116 are both in direct contact with the alignment layers 114A, 114B, for example. In such embodiments, the crystal lattice orientation of the ferroelectric layer 116 may be stabilized by the alignment layers 114A, 114B. The electrode layers 112A, 112B may include a same or similar material as the electrode layer 112 in FIG. 1, and may be formed using a same or similar formation method, thus details are not repeated. Similarly, the alignment layers 114A, 114B and the ferroelectric layer 116 may include a same or similar material and may be formed using a same or similar formation method as the alignment layer 114 and the ferroelectric layer 116 in FIG. 1 respectively, thus details are not repeated.

In some embodiments, the dielectric layer 117 is formed on the electrode layer 112B. In some embodiments, the dielectric layer 117 includes a high-k material having a dielectric constant greater than about 3.9, greater than about 10 or even greater than about 20, such as zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, titanium oxide, a hafnium dioxide-alumina ($HfO_2$—$Al_2O_3$) alloy, the like, or a combination thereof. The foregoing materials may be deposited by suitable fabrication techniques such as ALD, CVD, metalorganic CVD (MOCVD), PVD, thermal oxidation, UV-ozone oxidation, remote plasma atomic layer deposition (RPALD), plasma-enhanced atomic layer deposition (PEALD), molecular beam deposition (MBD), or combinations thereof. However, the disclosure is not limited thereto. In some embodiments, the dielectric layer 117 is a single layer. In some alternative embodiments, the dielectric layer 117 has a multi-layer structure.

In some embodiments, the channel region 118 is formed on the dielectric layer 117, and the source and drain regions 120 are formed at opposite sides of the electrode layer 112A, 112B on the channel region 118.

In some embodiments, by inserting the alignment layer 114A, 114B between the electrode layer 112A, 112B and the ferroelectric layer 116 respectively, the alignment layer alignment layer 114A, 114B may be electrically connected to the electrode layer 112A, 112B while keeping crystalline structure perfectly at the interface of the alignment layer 114A, 114B and the ferroelectric layer 116. Thus, the FeFET may have a high endurance performance.

Figure 4:
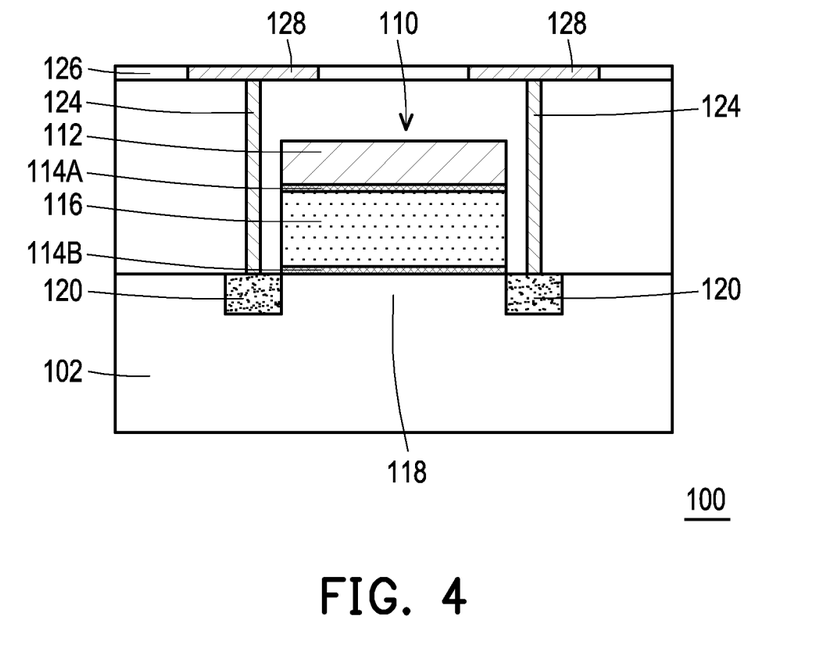
FIG. 4 is a cross-sectional view of a semiconductor device in accordance with some alternative embodiments of the disclosure.

FIG. 4 is a cross-sectional view of a semiconductor device in accordance with some alternative embodiments of the disclosure. Referring to FIG. 4, a semiconductor device 100 in FIG. 4 is similar to the semiconductor device 100 in FIG. 1, so similar elements are denoted by the same reference numeral and the detailed description thereof is omitted herein.

In some embodiments, the semiconductor device 100 is disposed in and on a substrate 102. In some embodiments, the semiconductor device 100 includes a transistor 110 such as a FeFET. The transistor 110 includes an electrode layer 112, alignment layers 114A, 114B, a ferroelectric layer 116, a channel region 118 and source and drain regions 120, for example.

In some embodiments, the source and drain regions 120 are doped regions in the substrate 102. The source and drain regions 120 are doped with the same conductive type dopants. For example, the source and drain regions 120 are doped with n-type dopants such as phosphorus or arsenic and configured for an n-type field-effect transistor, or alternatively, the source and drain regions 120 are doped with p-type dopants such as boron or $BF_2$ and configured for a p-type field-effect transistor. In some embodiments, the channel region 118 is formed in the substrate 102 between the source and drain regions 120. In some alternative embodiments, the channel region 118 is doped with a dopant to achieve extra stability. For example, the channel region 118 may be doped with silicon dopant or the like. In some embodiments, conductive lines 128 in a dielectric layer 126 may be electrically couple to the source and drain regions 120 through source and drain contacts 124 in a dielectric layer 122. However, the disclosure is not limited thereto.

In some embodiments, the ferroelectric layer 116 is disposed on the channel region 118, and the electrode layer 112 is disposed on the ferroelectric layer 116. In some embodiments, the alignment layer 114A is disposed between the electrode layer 112 and the ferroelectric layer 116, and the alignment layer 114B is disposed between the channel region 118 and the ferroelectric layer 116. In some embodiments, the alignment layer 114A is in direct contact with the ferroelectric layer 116, and the alignment layer 114B is in direct contact with the ferroelectric layer 116. In other words, the ferroelectric layer 116 is sandwiched between the alignment layers 114A, 114B, and opposite surfaces of the ferroelectric layer 116 are both in direct contact with the alignment layers 114A, 114B, for example. In such embodiments, the crystal lattice orientation of the ferroelectric layer 116 may be stabilized by the alignment layers 114A, 114B. However, the disclosure is not limited thereto. In some alternative embodiments, at least one of the alignment layers 114A, 114B is omitted. The electrode layer 112 may include a same or similar material as the electrode layer 112, and may be formed using a same or similar formation method, thus details are not repeated. Similarly, the alignment layers 114A, 114B and the ferroelectric layer 116 may include a same or similar material and may be formed using a same or similar formation method as the alignment layer 114 and the ferroelectric layer 116, respectively, thus details are not repeated.

In some embodiments, by inserting the alignment layer 114A, 114B between the electrode layer 112 and the ferroelectric layer 116 and between the channel region 118 and the ferroelectric layer 116 respectively, the alignment layer alignment layer 114A, 114B may be electrically connected to the electrode layer 112 and the channel region 118 while keeping crystalline structure perfectly at the interface of the alignment layer 114A, 114B and the ferroelectric layer 116. Thus, the FeFET may have a high endurance performance.

Figure 5:
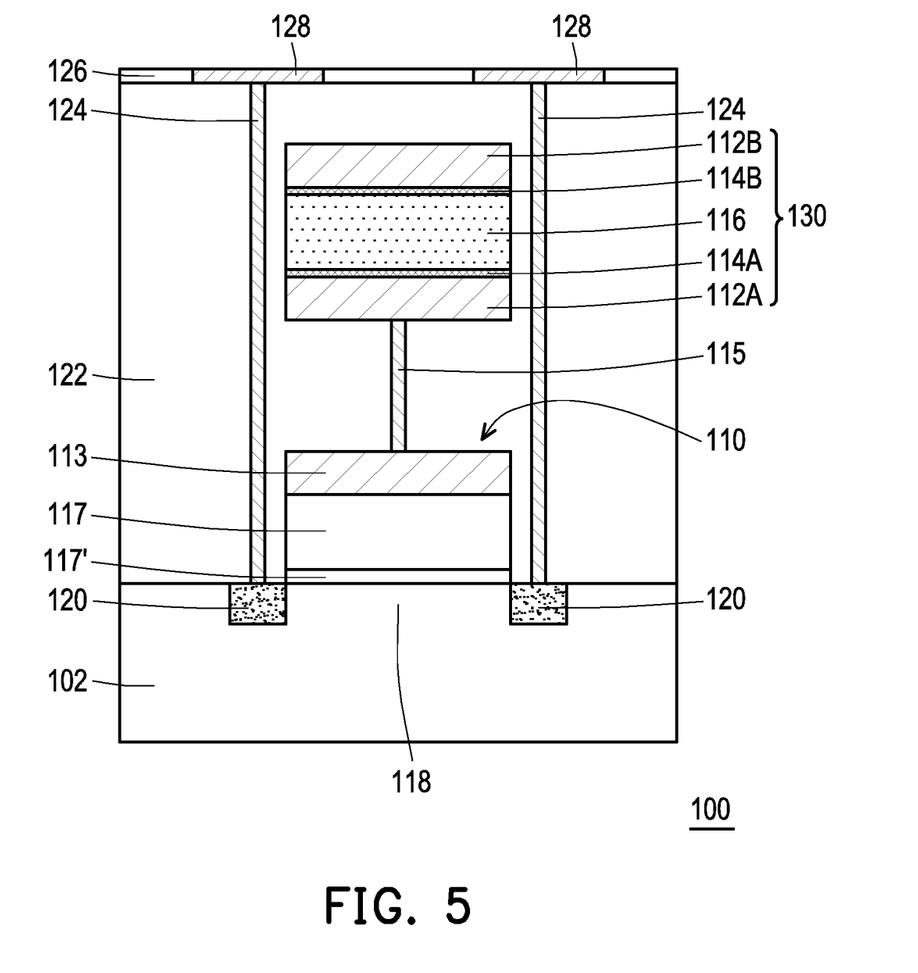
FIG. 5 is a cross-sectional view of a semiconductor device in accordance with some alternative embodiments of the disclosure.

FIG. 5 is a cross-sectional view of a semiconductor device in accordance with some alternative embodiments of the disclosure.

In some embodiments, a semiconductor device 100 includes a transistor 110 in and on a substrate 102 and a ferroelectric tunnel junction (FTJ) structure 130 electrically connected to the transistor 110. In some embodiments, the transistor 110 includes an electrode layer 113, a dielectric layer 117, a channel region 118 and source and drain regions 120.

In some embodiments, the source and drain regions 120 are doped regions in the substrate 102. The source and drain regions 120 are doped with the same conductive type dopants. For example, the source and drain regions 120 are doped with n-type dopants such as phosphorus or arsenic and configured for an n-type field-effect transistor, or alternatively, the source and drain regions 120 are doped with p-type dopants such as boron or $BF_2$ and configured for a p-type field-effect transistor. In some embodiments, the channel region 118 is formed in the substrate 102 between the source and drain regions 120.

In some embodiments, the dielectric layer 117 is disposed on the channel region 118, and the electrode layer 113 is disposed on the dielectric layer 117. In some embodiments, a dielectric layer 117' is further disposed between the dielectric layer 117 and the channel region 118. In some embodiments, dielectric constant (k-value) of the dielectric layer 117' is lower than dielectric constant (k-value) of the dielectric layer 117. For example, the dielectric layer 117 includes high-k material, and the dielectric layer 117' includes low-k material. The low-k material has a dielectric constant (k-value) lower than about 3.0, about 2.5, or even lower, for example. The low-k material may be silicon oxide, silicon carbide (SiC), silicon carbo-nitride (SiCN), silicon oxy-carbo-nitride (SiOCN), or the like. The high-k material has a dielectric constant greater than about 3.9, greater than about 10 or even greater than about 20, for example. The high-k material may be zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, titanium oxide, a hafnium dioxide-alumina ($HfO_2$—$Al_2O_3$) alloy, the like, or a combination thereof. In some embodiments, the electrode layer 113 may include a same or similar material as the electrode layer 112 in FIG. 1, and may be formed using a same or similar formation method, and thus details are not repeated.

In some embodiments, the FTJ structure 130 includes electrode layers 112A, 112B, alignment layers 114A, 114B and a ferroelectric layer 116. In some embodiments, the electrode layer 112A, the alignment layer 114A, the ferroelectric layer 116, the alignment layer 114B and the electrode layer 112B are sequentially formed on the electrode layer 113. In some embodiments, the alignment layer 114A is in direct contact with the ferroelectric layer 116, and the alignment layer 114B is in direct contact with the ferroelectric layer 116. In other words, the ferroelectric layer 116 is sandwiched between the alignment layers 114A, 114B, and opposite surfaces of the ferroelectric layer 116 are both in direct contact with the alignment layers 114A, 114B, for example. In such embodiments, the crystal lattice orientation of the ferroelectric layer 116 may be stabilized by the alignment layers 114A, 114B. However, the disclosure is not limited thereto. In some alternative embodiments, at least one of the alignment layers 114A, 114B is omitted. The materials, formation methods and the arrangement of the electrode layer 112A, the alignment layer 114A, the ferroelectric layer 116, the alignment layer 114B and the electrode layer 112B in FIG. 5 are the same as or similar to those in FIG. 3, thus details are not repeated. In some embodiments, the electrode layer 112A is electrically connected to the electrode layer 113 through a conductive via 115. The conductive via 115 may be disposed at any interconnection tiers. In other words, one or more connection tiers may be interposed between the transistor 110 and the FTJ structure 130, with conductive patterns of the connection tiers establishing electrical connection between the transistor 110 and the FTJ structure 130. In some embodiments, the material of the conductive via 115 includes cobalt, tungsten, copper, titanium, tantalum, aluminum, zirconium, hafnium, a combination thereof, or other suitable metallic materials.

In some embodiments, by inserting the alignment layer 114A, 114B between the electrode layer 112A, 112B and the ferroelectric layer 116 respectively, the alignment layer alignment layer 114A, 114B may be electrically connected to the electrode layer 112A, 112B while keeping crystalline structure perfectly at the interface of the alignment layer 114A, 114B and the ferroelectric layer 116. Thus, the FeFET has a high endurance performance.

Figure 6:
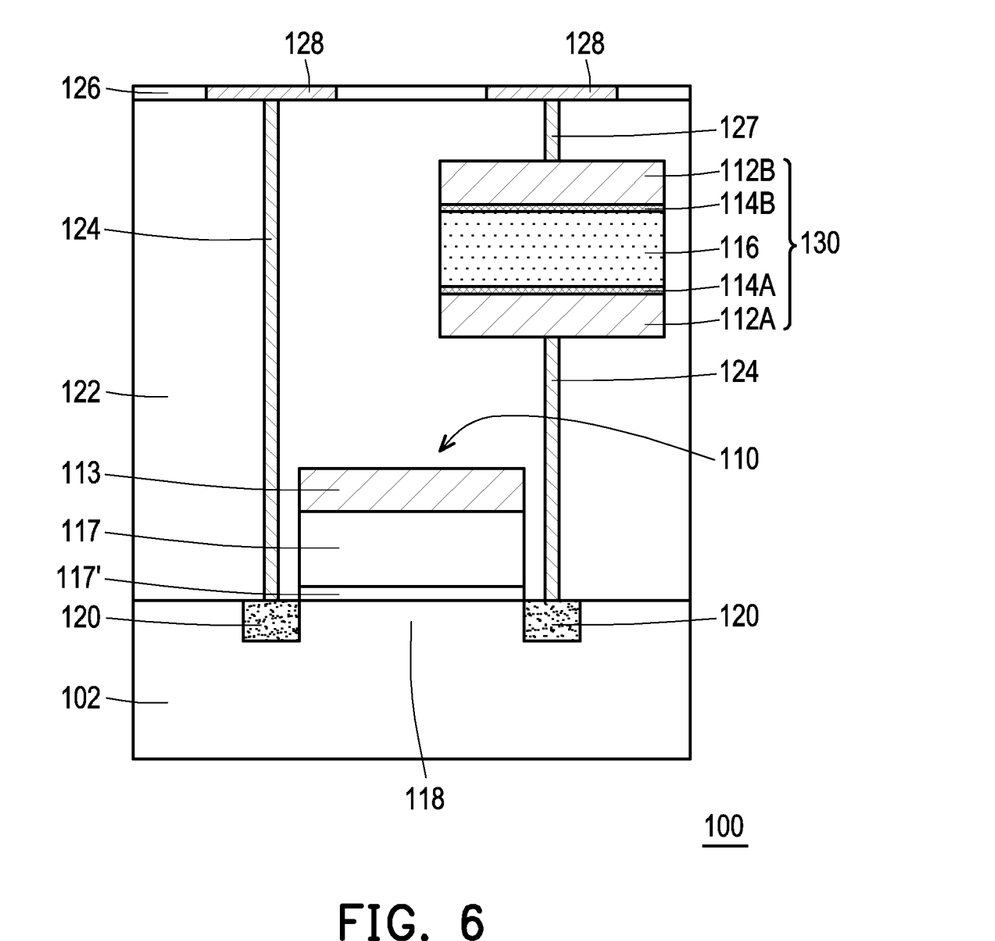
FIG. 6 is a cross-sectional view of a semiconductor device in accordance with some alternative embodiments of the disclosure.

FIG. 6 is a cross-sectional view of a semiconductor device in accordance with some alternative embodiments of the disclosure. Referring to FIG. 6, a semiconductor device 100 in FIG. 6 is similar to the semiconductor device 100 in FIG. 5, so similar elements are denoted by the same reference numeral and the detailed description thereof is omitted herein. The main difference lies in that the electrode layer 112A is electrically connected to the drain region 120 through the drain contact 124, and electrically connected to the conductive line 128 through a conductive via 127. The conductive via 127 may be disposed at any interconnection tiers. In some embodiments, the material of the conductive via 127 includes cobalt, tungsten, copper, titanium, tantalum, aluminum, zirconium, hafnium, a combination thereof, or other suitable metallic materials.

In some embodiments, the FTJ structure 130 connected to the drain contact 124 of the transistor 110 formed in and/or on the substrate 102 may be considered a memory cell of the semiconductor device 100. The semiconductor device 100 may be or include a high-density non-volatile memory such as a ferroelectric random-access memory (FeRAM), and the ferroelectric layer 116 is also referred to as a "storage layer." For example, the FTJ structure 130 may be connected to the drain region 120 of the transistor 110 receive current flowing through the transistor, which may be configured to act as a driving transistor for the FTJ structure 130. That is, the electrode layer 113 of the transistor 110 may be configured as a word line for the memory cells, while the conductive line 128 electrically connected to the drain region 120 may be configured to act as a bit line. In some alternative embodiments, one or more connection tiers may be interposed between the FTJ structure 130 and the conductive line 128, with conductive patterns of the connection tiers establishing electrical connection between the FTJ structure 130 and the conductive line 128. Furthermore, it should be noted that while the FTJ structure 130 may be formed on any metallization levels. In some alternative embodiments, the FTJ structure 130 may be connected through underlying conductive vias to the lower interconnection tiers.

Figure 7:
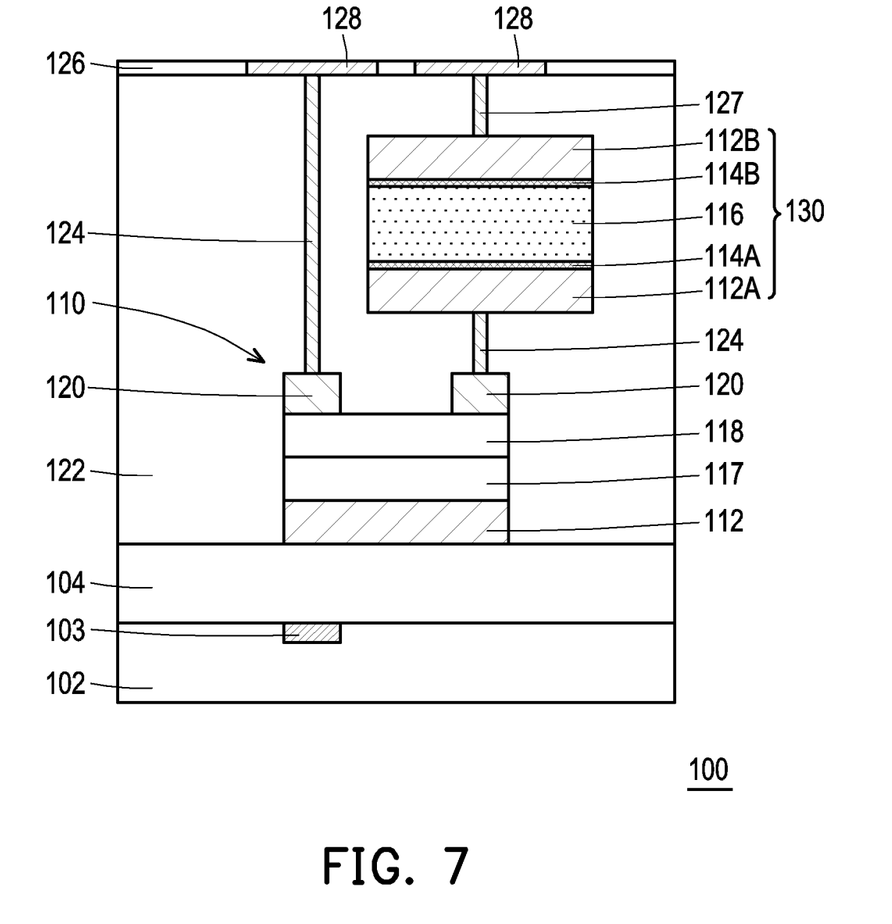
FIG. 7 is a cross-sectional view of a semiconductor device in accordance with some alternative embodiments of the disclosure.

FIG. 7 is a cross-sectional view of a semiconductor device in accordance with some alternative embodiments of the disclosure. Referring to FIG. 7, a semiconductor device 100 in FIG. 7 is similar to the semiconductor device 100 in FIG. 6, so similar elements are denoted by the same reference numeral and the detailed description thereof is omitted herein. The main difference lies in that the transistor 110 is formed on a dielectric layer 104 on a substrate 102. The electrode layer 112, the channel region 118 and the source and drain regions 120 are the same as or similar to those in FIG. 1 and the dielectric layer 117 the same as or similar to that in FIG. 3, thus details are not repeated. In some embodiments, the transistor 110 includes an electrode layer 112, a dielectric layer 117, a channel region 118 and source and drain regions 120, and the FTJ structure 130 includes electrode layers 112A, 112B, alignment layers 114A, 114B and a ferroelectric layer 116. In some embodiments, the semiconductor device 100 may be or include a high-density non-volatile memory such as a ferroelectric random-access memory (FeRAM).

In some alternative embodiments, the alignment layer may be applied in any other suitable memories such as memories with MFM (metal-ferroelectric-metal) structure, MFS (metal-ferroelectric-semiconductor) structure and MFMIS (metal-ferroelectric-metal-insulator-semiconductor) structure. It will be apparent that while the transistor 110 is illustrated with a specific transistor geometry, the disclosure is not limited thereto. For examples, the back-end-of-line transistor may be a planar transistor with back-gate geometry, double-gate geometry, a FinFET transistor, a gate-all-around transistor, or any other gate geometry which may be realized for back-end-of-line transistor.

In accordance with some embodiments of the disclosure, a semiconductor device includes a first electrode layer, a ferroelectric layer, a first alignment layer and a second electrode layer. A material of the first alignment layer includes rare-earth metal oxide. The ferroelectric layer and the first alignment layer are disposed between the first electrode layer and the second electrode layer, and the first alignment layer is disposed between the ferroelectric layer and the first electrode layer.

In accordance with some embodiments of the disclosure, a semiconductor device includes a first electrode layer, a ferroelectric layer, a first alignment layer, a channel region and source and drain regions. The first alignment layer is disposed between the first electrode layer and the ferroelectric layer, wherein a material of the first alignment layer includes rare-earth metal oxide. The ferroelectric layer and the first alignment layer are disposed between the first electrode layer and the channel region. The source and drain regions are disposed at opposite sides of the first electrode layer.

In accordance with some embodiments of the disclosure, a semiconductor device includes a ferroelectric tunnel junction (FTJ) structure and a transistor. The FTJ structure includes a first electrode layer, a ferroelectric layer, a first alignment layer and a second electrode layer. A material of the first alignment layer includes rare-earth metal oxide. The ferroelectric layer and the first alignment layer are disposed between the first electrode layer and the second electrode layer, and the first alignment layer is disposed between the ferroelectric layer and the first electrode layer. The transistor is electrically connected to the FTJ structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a ferroelectric tunnel junction (FTJ) structure, the FTJ structure comprising:
   a first electrode layer;
   a ferroelectric layer;
   a first alignment layer, wherein a material of the first alignment layer comprises rare-earth metal oxide, and the ferroelectric layer and the first alignment layer have the same crystal lattice orientation; and
   a second electrode layer, wherein the ferroelectric layer and the first alignment layer are disposed between the first electrode layer and the second electrode layer, and the first alignment layer is disposed between the ferroelectric layer and the first electrode layer; and
   a transistor, electrically connected to the FTJ structure.

2. The semiconductor device of claim 1, wherein the transistor comprises:
   a bottom gate on a substrate;
   a dielectric layer, on the bottom gate;
   a channel region, on the dielectric layer; and
   source and drain regions, at opposite sides of the bottom gate on the channel region, wherein one of the source and drain regions is electrically connected to one of the first electrode layer and the second electrode layer.

3. The semiconductor device of claim 1, wherein the transistor comprises:
   source and drain regions in a substrate;
   a channel region between the source and drain regions in the substrate;
   a dielectric layer, on the channel region; and
   a gate electrode layer, on the dielectric layer, wherein one of the source and drain regions is electrically connected to one of the first electrode layer and the second electrode layer.

4. The semiconductor device of claim 1, further comprising a second alignment layer between the ferroelectric layer and the second electrode layer, wherein a material of the second alignment layer comprises rare-earth metal oxide.

5. The semiconductor device of claim 4, wherein the second alignment layer is in direct contact with the ferroelectric layer.

6. The semiconductor device of claim 1, wherein the first alignment layer is in direct contact with the ferroelectric layer.

7. The semiconductor device of claim 1, wherein a sidewall of the first alignment layer is substantially flush with a sidewall of the ferroelectric layer.

8. A semiconductor device, comprising:
   a ferroelectric tunnel junction (FTJ) structure, comprising a ferroelectric layer, a first electrode layer and a first alignment layer disposed between the first electrode layer and the ferroelectric layer, wherein the first alignment layer comprises rare-earth metal oxide; and
   a transistor, electrically connected to the FTJ structure, wherein the transistor is disposed between a substrate and the FTJ structure, and a gate electrode of the transistor is electrically connected to the FTJ structure through a contact between the gate electrode and the first electrode layer.

9. The semiconductor device of claim 1, wherein the material of the first alignment layer comprises at least one of LaO and $CeAlO_3$.

10. The semiconductor device of claim 1, wherein the transistor comprises:
    a first dielectric layer between the gate electrode and a substrate and a second dielectric layer between the first dielectric layer and the substrate, wherein a dielectric constant of the second dielectric layer is lower than a dielectric constant of the first dielectric layer; and
    source and drain regions, in the substrate and at opposite sides of the gate electrode, wherein one of the source and drain regions is electrically connected to one of the first electrode layer and the second electrode layer.

11. A semiconductor device, comprising:
    a ferroelectric tunnel junction (FTJ) structure, comprising:
    a first electrode layer;
    a ferroelectric layer comprising HZO; and
    a first alignment layer, wherein the first alignment layer is disposed between the first electrode layer and the ferroelectric layer, and a material of the first alignment layer comprises rare-earth metal oxide and has a band gap smaller than 50 meV, and the ferroelectric layer and the first alignment layer have the same crystal lattice orientation; and
    a transistor, electrically connected to the FTJ structure.

12. The semiconductor device of claim 11, wherein the transistor comprises a channel region and source and drain regions at opposite sides of the channel region.

13. The semiconductor device of claim 12, wherein the FTJ structure further comprises:
    a second electrode layer; and
    a second alignment layer between the ferroelectric layer and the second electrode layer, wherein a material of the second alignment layer comprises rare-earth metal oxide.

14. The semiconductor device of claim 13, further comprising a contact disposed between the second electrode layer and one of the source and drain regions.

15. The semiconductor device of claim 13, wherein the channel region and the source and drain regions are disposed in a substrate, and the transistor further comprises:
    a third electrode layer over the channel region;
    a first dielectric layer between the third electrode layer and the channel region; and a second dielectric layer between the first dielectric layer and the channel region, wherein dielectric constant of the second dielectric layer is smaller than dielectric constant of the first dielectric layer.

16. The semiconductor device of claim 15, further comprising a contact disposed between the second electrode layer and the third electrode layer.

17. The semiconductor device of claim 12, wherein the source and drain regions are disposed between the channel region and the FTJ structure, and the transistor further comprises:
   a third electrode layer below the channel region; and
   a first dielectric layer between the third electrode layer and the channel region.

18. The semiconductor device of claim 8, wherein a lattice constant mismatch between the first alignment layer and the ferroelectric layer is smaller than 5%.

19. The semiconductor device of claim 8, wherein the rare-earth metal oxide comprises LaO, CeO, $CeAlO_3$ or a combination thereof.

20. The semiconductor device of claim 8, wherein a material of the ferroelectric layer comprises HfZrO, HfAlO, HfLaO, HfCeO, HfO, HfGdO, HfSiO or a combination thereof.

* * * * *